United States Patent

Pignon

[19]

[11] Patent Number: 6,158,016

[45] Date of Patent: Dec. 5, 2000

[54] METHOD FOR THE PROCESSING OF DEFECTIVE ELEMENTS IN A MEMORY

[75] Inventor: Patrick Pignon, Chateauneuf le Rouge, France

[73] Assignee: STMicroelectronics S.A., Gentilly, France

[21] Appl. No.: 08/168,713

[22] Filed: Dec. 16, 1993

[30] Foreign Application Priority Data

Dec. 16, 1992 [FR] France .................................. 92 15174

[51] Int. Cl.⁷ ..................................................... G06F 11/00
[52] U.S. Cl. .................................................. 714/6; 714/710
[58] Field of Search .................................. 371/10.1, 10.2, 371/10.3, 21.1, 21.2; 365/200, 201; 714/6, 710

[56] References Cited

U.S. PATENT DOCUMENTS

| | | | |
|---|---|---|---|
| 3,755,791 | 8/1973 | Arzubi ............................. | 340/173 R |
| 3,940,740 | 2/1976 | Coontz ............................. | 340/166 R |
| 4,628,509 | 12/1986 | Kawaguchi ........................ | 371/10.3 |
| 4,860,260 | 8/1989 | Saito et al. ....................... | 371/10.3 |
| 4,942,556 | 7/1990 | Sasaki et al. ..................... | 371/10.1 |
| 5,058,059 | 10/1991 | Matsuo et al. .................... | 371/10.3 |
| 5,235,548 | 8/1993 | Kurkowski ........................ | 365/200 |
| 5,299,161 | 3/1994 | Choi et al. ....................... | 371/10.1 |
| 5,327,382 | 7/1994 | Seno et al. ....................... | 365/210 |
| 5,406,565 | 4/1995 | MacDonald ....................... | 371/10.3 |

FOREIGN PATENT DOCUMENTS

| | | |
|---|---|---|
| 0249903 | 12/1987 | European Pat. Off. . |
| 2611400 | 9/1988 | France . |

OTHER PUBLICATIONS

Goto et al "A 3.3v 12ns 16mb CMOS SRAM" 1992 IEEE International Solid–State Circuits Conference pp. 216–217.

Jain et al "A Fault Tolerant Array Processor Designed for Testability and Self–Reconfiguration" 1991 IEEE Journal of Solid State Circuits pp. 778–788.

*Primary Examiner*—Robert W. Beausoliel
*Assistant Examiner*—Pierre Eddy Elisca
*Attorney, Agent, or Firm*—Theodore E. Galanthay; Stephen C. Bongini; Fleit, Kain, Gibbons, Gutman & Bongini P.L.

[57] ABSTRACT

A method for the repairing of defective elements of a memory in integrated circuit form, comprising redundant elements to replace defective elements, consists of the following steps:

A) For each defective element detected:
  searching for a first non-defective redundant element by the testing of the redundant elements;
  assigning this first redundant element to the defective element.

B) When the assigning of a redundant element to each defective element has been achieved, replacing each defective element by the assigned redundant element.

16 Claims, 2 Drawing Sheets

METHOD FOR THE PROCESSING OF DEFECTIVE ELEMENTS IN A MEMORY

BACKGROUND OF THE INVENTION

1. Field of the Invention

The present invention relates to a method for the processing of the defective elements in a memory made in integrated circuit form and comprising redundancy elements. It can be applied more particularly to the testers of such memories.

The greater the information storage capacity of a memory and the finer the integration technology, the greater is the degree to which these memories are liable to suffer manufacturing defects. Just one defect in a memory comprising a million cells will entail the discarding of this memory. Now, the trend in industry is towards constantly increasing the storage capacity and the degree of miniaturization.

2. Description of the Prior Art

To increase overall manufacturing efficiency, redundant memory networks have been used.

Thus, when a tester carries out the tests on integrated circuit wafers, if it detects one or more defective memory elements, then it will be able to replace them with redundant elements: the memory will then appear to be good on the whole and will not be discarded.

In this way, it is possible to recover memories comprising a limited number of defects.

It will be recalled that a memory is organized as a matrix of rows and columns. At each intersection of a column and a row, there is a cell that can be selected by means of the address of the column and the address of the row, the contents of this cell being read on the column.

The defects may relate to:

isolated memory cells, for example defects in the gate oxide of a cell;

adjacent rows of cells, for example a short-circuit between two rows by residual filaments of poorly etched polycrystalline silicon;

several rows of cells or several columns, for example, resulting from a poor contact inside a decoder used to designate an entire group of rows or an entire group of columns;

two columns, for example resulting from a short-circuit by an aluminum bridge which sets up an abnormal connection between two lines of aluminum corresponding to two adjacent columns;

etc.

The memory tester memorizes all the defects that appear during the testing of this memory to analyze them and determine the defective elements.

It must then connect the appropriate redundant elements, as replacements for the defective elements in such a way that the user of the memory has no particular constraint due to this replacement: it is said that the replacement must be transparent to the user who has access only to the external terminals of the integrated circuit.

For large-sized memories (comprising several hundreds of thousands of bits or more), the redundant elements will typically be whole rows of cells rather than individual cells, it being easier to replace rows in view of the constraints of the space occupied by circuits that need to be added so that the replacement is transparent to the user. However, certain defects, like short-circuits by aluminum bridges between two columns, can be replaced only through the replacement of these columns by other columns.

The replacing of a column is more difficult than that of a row. Indeed, when the memory is organized in words of several bits, a memory address then designates, firstly, a single determined row and, secondly, a number of columns equal to the number of bits.

The replacement of a defective column can be done by routing to a redundant column instead of to a defective column. A very cumbersome circuitry is then needed to:

memorize the precise address of the defective column;

deactivate the normal reading of the information elements coming from this column;

read the information elements coming from a redundant column;

bring these information elements to the reading amplifier of the defective column.

A similar circuitry must be designed for the writing of information elements in the redundant column.

Another way of replacing a defective column consists in making provision, for example in a memory organized in 8-bit words, for a group of eight redundant columns designed to replace a group of eight columns, at least one of which is defective. In other words, if a memory address designates eight columns and if the tester detects a defect in at least one of these eight columns, it replaces the entire group of eight columns designated by this address by a group of eight redundant columns.

Other approaches are possible and the choice of any one of them depends on the structure of the memory, the constraints of the space occupied by the necessary circuitry and the desired repairing capacity.

Hereinafter, the term "defective element" of a given memory shall be understood to mean the smallest structure of rows or columns of this memory that can be repaired by a redundant element of a same structure of rows or columns.

It may therefore be a single row or column, or a set of rows or columns, at least one of which is defective.

It will be noted that certain memories implement only one type of redundancy, for example column redundancy.

It is the tester, when it has been able to prepare a list of the defective elements of a given memory, that implements the repairing of this memory: it replaces each defective element by a redundant element.

Generally, in the memorizing elements of a memory, it records one information element identifying the defective element and one information element identifying the redundant element that replaces it.

These memorizing elements may be a memory network or a battery of fuses, and constitute the redundancy activation table of the memory.

It is this table that makes it possible, during the subsequent functioning of the memory, to select the redundancy element corresponding to a defective element, the address of which is presented to the input of the memory.

After each repair of a defective element, the tester applies the defect detection test to this repaired defective element. This test consists chiefly in verifying that an information element read is truly the one that has been written earlier. If the test is positive, the memory is good. If it is negative, i.e. if at least one defect is found, the memory is discarded. (It is not possible to repair a defective element that has already been repaired, i.e. one that has already been replaced by a redundancy element: the repair is generally irreversible.)

Furthermore, it is generally preferred to repair first of all the column elements before the row elements for it is the column elements that statistically produce the greatest number of defects.

Now, assuming that a row is highly defective, the defective columns being repaired first, it is highly probable that the repaired columns will always appear to be defective and that the memory will be discarded, while the defects detected on the repaired columns may come from the highly defective row that has not yet been repaired.

Indeed, it will be recalled that the redundant columns are placed on the continuation of the rows of the memory map, and the redundant rows on the columns of the memory plane.

SUMMARY OF THE INVENTION

An object of the invention is a method of repair that can be used to carry out the replacement of a defective element only when it can be practically certain that the repair itself will not be defective. According to the invention, the probability of success of the operation in increased and, at the same time, a reduction is achieved in the time devoted to the repair when this repair is actually impossible.

Indeed, the test for the detection of defects in a memory relates only to the operational elements of this memory. The redundancy networks are not tested. Now, they may also have defects similar to those described here above.

According to the invention, the tester tests the redundant elements to carry out a first operation for the assigning of a redundant element to a defective element or the pairing of a redundant element with a defective element. When it has been possible to pair all the defective elements, the replacement is done in memory by filling the redundancy table. Then the repaired elements are tested.

As claimed, the invention relates to a method for the repairing of defective elements of a memory comprising redundant elements.

According to the invention, the repairing method comprises the following steps for a tester:

1) For each defective element detected:
   searching for a first non-defective redundant element by the testing of the redundant elements of the memory, and
   assigning this first redundant element to the defective element; and
2) When the tester has succeeded in assigning a redundant element to each defective element, replacing, in the memory, each defective element by the assigned redundant element.

Advantageously, the test performed on the redundant elements is a speedy test that enables the detection of major defects. Preferably, it will be a reading test.

It is indeed always important not to increase the testing time and, at the same time, to seek optimum reliability, for the cost of the testing procedures is always far too high. Thus, according to the invention, the redundant elements that have a reading defect are kept away from the repairing operation. The defective elements are then repaired with tested redundant elements. Advantageously, it is only when all the defective elements have been repaired that the repair itself is tested.

BRIEF DESCRIPTION OF THE DRAWINGS

Other features and advantages of the invention are described in detail in the following non-restrictive description, made with reference to the appended drawings, of which.

SUMMARY OF THE INVENTION

Figure 1:
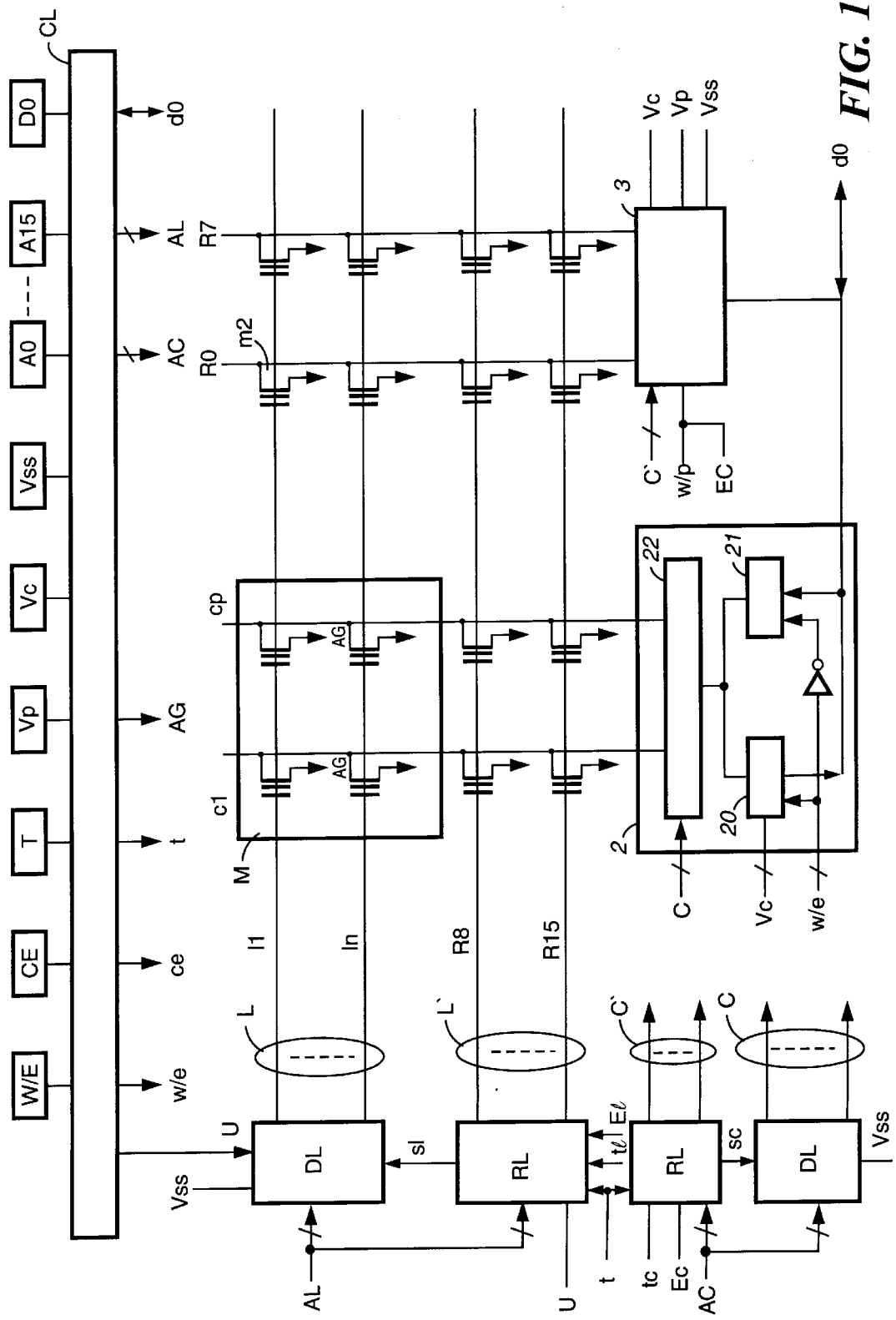
FIG. 1 shows a schematic drawing of a memory with a system of redundancy of rows and columns and, FIG. 2 is a flow chart of the repairing method according to the invention.

FIG. 1 gives a schematic view of a memory structure with redundancy of rows and columns.

For clarity of explanation, the simple case of a memory organized in words of one bit only has been shown. The corresponding input/output pin of the memory is referenced D0. The nxp memory array M comprises n rows 11 to 1n (each of p cells), and p columns c1 to cp (each including n cells). The gates of the p cells are connected together in one row, and the drains of the n cells are connected together in one column. The sources of the cells of the memory map are connected in common to a potential AG controlled by a logic circuit CL of the circuit. In general, this potential is the ground. In certain cases, it corresponds to a high voltage (for example, for the erasure of an EPROM flash memory).

An address of a word of the memory array is encoded in the example on 16 address bits A0–A15 which can be segmented into a row address AL and a column address AC. In the example of a x1 memory, the address designates only one cell of the memory array.

A control logic circuit CL is connected to pins or pads of the memory. In a standard way, it thus receives a signal for the selection of the memory CE, a read/write control signal W/E, a test mode signal T, the supply voltage Vc, programming voltage Vp and ground voltage Vss, the data input/output signals limited in the example to the signal D0 alone and the address signals A0–A15. According to the type of memory envisaged, the programming voltage may be a high voltage of the order of 12 volts or equal to the supply voltage Vc.

At output, the logic circuit CL delivers a signal U for the control of the rows, the copies w/e, do, ce, t of the signals W/E, D0, CE, T, the supply signals vcc and ground, the row address signal AL and column address signal AC.

A row decoder DL receives, at input, the row address AL, the voltage control signal U, the ground Vss and an invalidation signal sl. This signal sl is activated by a row redundancy circuit RL, when this circuit has recognized a defective row address and when the redundancy then has to be activated.

The row decoder, if it is not invalidated by the signal sl, delivers an output L on one of n lines (one per row) which selects that row, among the n rows, that corresponds to address AL, by applying the voltage control signal U to this row.

The output L carries the other rows in general to the ground Vss.

The voltage control U depends on the operation to be performed on the row: reading, writing of a logic "0" or writing of a logic "1". It may be equal to Vc, Vp or Vss. It is recalled that the voltage to be applied depends on the type of memory envisaged (EEPROM, EPROM, flash EPROM, RAM etc). It is recalled also that, in the case of an EPROM type memory, one logic level, ("0" for example,) is written electrically but the other logic level (e.s. "1") is obtained by ultra-violet erasure. For an EEPROM or flash EPROM memory, the writing of a "1" and or a "0" are done electrically.

If the row decoder DL is invalidated by the signal sl, it keeps its output L at the ground Vss of the circuit.

The row redundancy circuit RL receives, at input, the row address AL, the voltage control U, the ground Vss, the test mode signal t, a read/write signal E1 and a control signal tl.

During normal operation (t=0), when the RL defects a match between the row address AL and a start row address, it delivers an invalidation signal sl to the row decoder and an output L' with m components to activate a redundancy row of a network of m redundant rows, where m=8 in the example (rows R8 to R15).

The row to be activated is indicated in a correspondance table of the circuit RL, which contains addresses of defective rows and, for each row, the address or the identification of the redundant row that replaces it. This table is generally a memory comprising one unerasable memory zone per redundant element for the recording of a defective element address therein.

The circuit RL makes a comparison between the address AL and these defective addresses. As the case may be, its output sl deactivates the row decoder DL and it delivers an output L' that selects the redundant row corresponding to the address AL and applies the voltage control signal U to it.

A column decoder DC receives, at input, the column address AC, an invalidation signal sc and the voltage logic levels Vc and Vss. If it is not invalidated by the signal sc, it delivers a logic output C with p components (one per column) which selects that column, among p columns, which corresponds to the address AC (the selected column being at Vc and the other columns being at the ground Vss).

This logic output C enables the routing of the addressed column to the input/output d0 and the application, to this column, of a voltage level determined according to the operation to be performed: reading, writing of a "1" or a "0".

The routing to output is done by an input/output control circuit 2 comprising a routing circuit 22, an output interface 20 and an input interface 21. This circuit receives, at input, the read/write signal w/e, the logic output C and the different voltage levels Vc, Vp, Vss. It is furthermore connected to the data input/output signal d0.

If a reading command (w/e=0) is presented, the interface 20 is validated. If a writing command (w/e=1) is presented, the interface 21 is validated.

The circuit 22 connects the column designated by the logic output C to the input/output interfaces 20, 21.

The voltage level corresponding to the read/write command w/e is applied to the column designated by the output C of the column decoder DC, by the corresponding interface 20 or 21 that is selected. For example, for a reading command, the interface 20 applies a reading voltage to this column routed by the circuit 22. For an EPROM, this reading voltage is of the order of one volt. For a RAM, it is generally equal to Vss. In the case of a writing command, the circuit 21 applies the voltage Vss or a voltage of the order of Vp/2 to this column, as a function of the data element to be written, "1" or "0".

It is recalled here that the applicable voltage levels depend also on the technologies and the type of memory used.

If the column decoder circuit DC is invalidated by the signal sc, it keeps its output C at the ground Vss of the circuit.

The column redundancy circuit RC receives, at input, the column address AC, the test mode signal t, a reading/writing signal Ec and a control signal tc.

In the example, the associated network of redundant columns comprises r=8 redundancy columns R0 to R7.

The redundancy circuit RC contains, in a correspondence table, addresses of defective columns and, for each of these, the address or the identification of the redundant column that replaces it. This table is generally a memory comprising one unerasable memory zone per redundant element for the recording therein of a defective element address.

During normal operation (t=0), it makes a comparison between the address AC and these defective addresses contained in the correspondence table. As the case may be, it delivers an invalidation signal sc to the column decoder DC and an output C' with r components to select the redundant column designated in the table.

This output C' is applied to an input/output control circuit 3 of the redundancy columns.

The input/output control circuit 3 is similar to the circuit 2. At input, it receives the writing/reading signal w/e, the signal Ec, the logic output C' and the different voltage levels Vc, Vp, Vss. It is also connected to the data input/output signal d0.

The circuit 3 makes it possible to connect the redundancy column designated by the signal C' to the input/output pin D0 by means of an input interface for a write command (w/e=1) or by means of an output interface for a reading command (w/e=0) and to apply the requisite level of voltage to it.

In test mode t=1, a tester on wafers can apply other control signals at different test points.

This is the case in particular with the read/write signals E1 and Ec and control signals t1 and tc applied to the redundancy circuits RL, RC and 3.

The read/write signals E1 and Ec, for their part, make it possible, in test mode (t=1), to obtain access directly to the different redundancy cells in writing and in reading mode.

This access is obtained sometimes by the selection of a redundant row and a column of the memory map (cell m1), sometimes by the selection of a redundant row and a redundant column (cell m2), and sometimes by the selection of a row of the memory map and of a redundant column.

For example, to achieve the selection, in writing mode, of the redundant cell referenced ml in FIG. 1, the address of the redundant row R8 is presented to AL while, at the same time, the signal E1 is activated in writing mode. Simultaneously, the address of the column c1 of the memory map is presented to AC and the signal w/e is activated in writing mode.

To achieve the selection, in reading mode, of the redundant cell referenced m2 in FIG. 1, the address of the row 11 of the memory map is presented to AL while, at the same time, the signal w/e is activated in reading mode. Simultaneously, the address of the redundant column R0 is presented to AC and the signal Ec is activated in writing mode.

For example, to fill the correspondence table of the column redundancy:

the test mode is activated (t=1);

the column redundancy control signal is activated (tc=1);

to the address AC, there is presented the address of the memory zone of the redundant column to be selected in the correspondence table, followed by the address of the defective column that it replaces.

The table therefore has the form:

| Table address | redundant column | AC defective column address |
|---|---|---|
| 0 | R0 | 5 |
| 1 | R1 | 12 |
| 2 | R2 | 124 |
| 3 | R3 | / |
| 4 | R4 | / |

-continued

| Table address | redundant column | AC defective column address |
|---|---|---|
| 5 | R5 | / |
| 6 | R6 | / |
| 7 | R7 | / |

The row redundancy correspondence table is filled identically by means of the address AL and the signals t and tl.

We have just described a memory, the structure of which enables the activation of the redundancy of rows and columns, with filling by the tester of correspondence tables and with the possibility of direct reading/writing access to redundant elements. Many different memory structures are available which allow the same functions, volatile memory structures (RAM) in particular.

Figure 2:
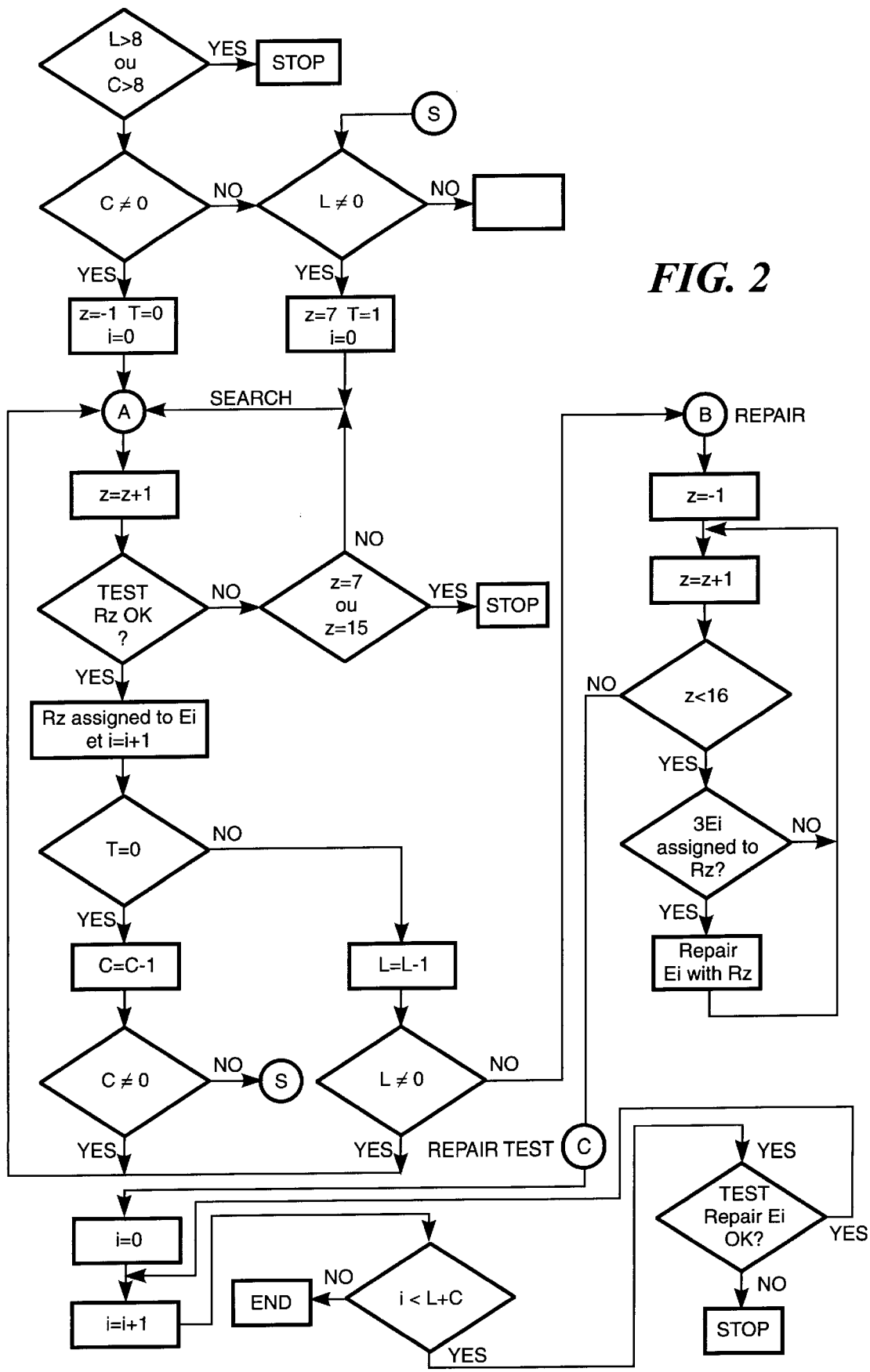

The repairing method according to the invention can be applied to all these memories. It will be described with reference to FIGS. 1 and 2, the tester on wafers having already carried out the defect detection test on the memory map and having drawn up a list of defective elements Ei, where i=(1, ... L+C), L being the number of defective rows and C being the number of defective columns. In the memory structure exemplified in FIG. 1, a defective element is a column or a row of the memory.

First of all, the repairing method cannot be implemented if there are not enough redundant elements in each class. In the example, where there are m=8 redundant rows and r=8 redundant columns, it must be ascertained that L is smaller than or equal to 8 and that c is smaller than or equal to 8. Should this not be the case, the memory map is irreparable, and the memory is discarded. This is the step marked STOP in the flow chart. If the memory can be repaired, then the repairing method is applied.

According to the invention, this method comprises essentially two steps:

a searching step A and a repairing step B.

The searching step consists, for each defective element Ei, in making a search for the first redundant element for which a test will give a positive result.

The search is aimed at setting aside redundant elements which have major defects that can easily be repaired, so as to avoid lengthening the repair procedure. Preferably, the procedure will be limited to a simple reading test at the nominal voltages of the memory. Since the redundant elements are rows or columns, the test consists, for example on a redundant row, in selecting this row, and in selecting each of the columns separately or again simultaneously by groups, according to the possibilities offered by the memory, and in reading the selected cell or cells. In this case, the state that is read corresponds to a blank state of the redundant cells which, depending on the technologies, corresponds to an erased or programmed state. It is recalled that a cell is blank when it has never been written on. This is notably the case when the article has come off the manufacturing line, at the time of the test.

It is also possible to carry out a read/write test if the writing of the memory is not an excessively delicate operation, especially if it does not implement high voltages.

Preferably, the method starts with the processing of the columns and then of the rows. It has indeed been noted that the columns are generally the site of a greater number of defects. The defective elements Ei have therefore been numbered as follows:

defective columns: E1 to EC defective rows: EC+1 to EC+L and the redundant elements Rz:

redundant columns from R0 to R7 redundant rows R8 to R15.

With a numbering system such as this, the search step therefore entails firstly the processing of the columns. The first defective element E0 is taken, and then a search is made for the non-defective redundant element Rz starting with R0.

This element Rz is then attributed to E0.

The next defective element E1 and the first non-defective redundant element are "taken, starting with the redundant element that follows the one which has been assigned and so on and so forth.

If there are many defective redundant elements among R0 ... R7, it will no longer be possible to assign a redundant element to all the defective elements E1 to EC: the memory cannot be repaired. This is the step STOP.

If all the defective elements E1 to EC have been assigned a non-defective redundant element among R0 ... R7, then the operation goes to the processing of the rows. Either it is possible to assign a redundant element, among R8 ... R15, that is positively tested to each defective element EC+1 ... EC+L or else it is not possible. In the latter case, the memory is discarded. If not, the operation goes to a repairing stage.

It will be noted that the fact of processing the columns initially optimizes the testing time. Indeed, if there are few defects in the redundant columns, experience shows that the same will probably be true of the rows. On the contrary, if the memory is rather defective, it is probable that many columns will be defective and the repairing method will stop very soon.

The repairing step B consists, for the tester, in filling the row and column correspondence tables of the memory, with the pairs formed by defective elements and redundant elements, as constituted in the step A.

It will be noted therefore that the passage to this step is done only when the search/assignment step has been properly done.

The repairing step then consists, for the tester, in taking each of the redundant elements that it has paired with a defective element and in filling the associated correspondence table accordingly. When it has processed all the column and row elements, the memory is repaired.

Advantageously, the tester resumes the detection test on the memory map, which it applies to the repaired defective elements. It thus ascertains that the redundancy works accurately. Indeed, at the step A, direct access is had to the redundant elements. Hence, the testing is not done on all the circuits used in redundancy, notably the routing circuits. Here a complete test is done on the repaired elements. This is the step referenced C in FIG. 2. A test is done therefore on all the circuit elements activated in redundancy. This test consists in carrying out a reading/writing operation of a data element and of its complementary data element by addressing the defective element, as would be done by a user. The reading is preferably done with a supply voltage Vc that can be made to vary in the range of operation specified in the specifications sheet. For example this voltage can be made to vary between 4 and 6 volts.

The memory is then completely qualified. Externally, nothing distinguishes it from a faultless memory.

The method of the invention makes it possible to improve the reliability of the repair: when the step A has been successfully carried out, in practice it is possible to be practically certain that the memory will be good after the repairing step B. There is no risk of leaving the repair process because of an unrepaired element which makes it appear as if a repaired element is defective.

The repairing method according to the invention is highly efficient for the major causes of failure of the repairing operation are immediately eliminated. This method can be applied to different" redundancy and memory structures. In particular, when the memory map is organized in words of g bits with n rows and g sets of p columns, each set being associated with r redundancy columns, a defective element may be, in certain structures, constituted by the g columns of a memory word, each having the same rank h among p columns in each set, at least one of which is defective. A redundant element will then be constituted by g redundancy columns, one in each set and each having having the same rank j among r redundancy columns. The test for the searching and assigning operations is then done on the g redundancy columns.

If the defective element is constituted by a column having a rank h among p columns in a single set, the redundant column will be taken from among the r redundant columns associated with this set. And it is this redundant column that will be tested.

In every type of structure, a defective row will generally be replaced by a redundant row.

What is claimed is:

1. A method for replacing defective elements of a memory array further comprising redundant elements, the memory array having undergone a test for the detection of defective elements, wherein said method comprises the following steps:
   a) for each defective element detected:
      searching for a first non-defective redundant element which is unassigned by testing of the redundant elements which have not been assigned, and then
      assigning this first non-defective redundant element to the defective element; and thereafter
   b) after the assigning of a redundant element to each defective element has been achieved, replacing each defective element with the assigned redundant element.

2. A method according to claim 1, further comprising the additional step of, after said step B, testing the locations of said defective elements to ascertain whether the replacement method has been successful.

3. A method according to claim 1, the memory array being organized into n rows and g sets of p columns, each set being associated with r redundancy columns wherein, for a defective element constituted by g columns, one of a same rank h among p ranks of columns in each set, at least one of the g columns being defective, a redundant element is constituted by g redundancy columns, one of a same rank j among r redundancy columns in each set, the test of a redundant element being done on its g redundancy columns.

4. A method according to claim 1, the memory array being organized in n rows and g sets of p columns, each set being associated with r redundancy columns, wherein for a defective element constituted by a defective column having a rank h among the p columns of a set, a redundant element to replace this defective element is a redundancy column with a rank j among r of this same set.

5. A method according to claim 1, the memory array being organized in n rows and g sets of p columns and associated with m redundancy rows, wherein for a defective element constituted by a defective row among n, a redundant element is constituted by a redundancy row among m.

6. A method according to claim 1, wherein said redundant elements should be blank, and wherein the testing of a redundant element consists in reading this element to ascertain that said redundant element is actually blank.

7. A method according to claim 6, wherein said step of reading is done by the application of a nominal supply voltage to the memory circuit.

8. A method according to claim 7, wherein said step of testing a redundant element is recommenced with a complementary piece of data.

9. A method according to claim 1, wherein the testing of a redundant element consists in:
   programming a piece of data in this element; and
   reading this element to ascertain that this piece of data is truly programmed.

10. A method according to claim 9, wherein said step of reading is done by the application of a nominal supply voltage to the memory circuit.

11. A method according to claim 10, wherein said step of testing a redundant element is recommenced with a complementary piece of data.

12. A method according to claim 1, wherein the detection test on a replaced defective element consists in:
   programming a piece of data in this element; and
   reading this element by making the supply voltage applied to the memory circuit fall within a range of permitted values.

13. A method for replacing of defective elements in a memory with redundant elements, comprising the steps of:
   testing the memory array to thereby find defective elements; and
   repairing the memory by
      a) repeatedly, for each defective element detected by said testing step:
         searching for a first non-defective redundant element, by testing the redundant elements, and then
         assigning this first redundant element to the defective element; and thereafter
      b) after the assigning of a respective redundant element to each defective element has been achieved, replacing each defective element by the assigned redundant element.

14. The method of claim 13, wherein, if assigning of a respective redundant element to each defective element is found to be impossible, the memory is flagged as bad before any of said replacing steps are performed.

15. The method of claim 13, wherein said memory chip provides n bits of output simultaneously, where n is an integer greater than one, and wherein said redundant elements are organized in groups of n.

16. The method of claim 13, further comprising the subsequent step of testing said memory chip to confirm correct operation thereof.

* * * * *